United States Patent [19]
Kobayashi et al.

[11] Patent Number: 5,521,864
[45] Date of Patent: May 28, 1996

[54] NON-VOLATILE SEMICONDUCTOR MEMORY DEVICE ALLOWING FAST VERIFYING OPERATION

[75] Inventors: Shinichi Kobayashi; Hiroaki Nakai; Motoharu Ishii; Atsushi Ohba; Tomoshi Futatsuya; Akira Hosogane, all of Hyogo, Japan

[73] Assignee: Mitsubishi Denki Kabushiki Kaisha, Tokyo, Japan

[21] Appl. No.: 385,866

[22] Filed: Feb. 9, 1995

[30] Foreign Application Priority Data

Feb. 15, 1994 [JP] Japan ................................. 6-018482

[51] Int. Cl.[6] ................................................ G11C 11/34
[52] U.S. Cl. ........................... 365/185.22; 365/185.29; 365/203
[58] Field of Search ............................. 365/185.22, 218, 365/189.05, 203, 230.04, 185.24

[56] References Cited

U.S. PATENT DOCUMENTS 5,297,096  3/1994  Terada ..................... 365/218
5,379,256  1/1995  Tanaka ..................... 365/185

OTHER PUBLICATIONS

"A Quick Intelligent Program Architecture for 3V–Only NAND–EEPROMS", Tanaka et al., 1992 Symposium on VLSI Circuits Digest of Technical Papers, pp. 20–21.

Primary Examiner—A. Zarabian
Attorney, Agent, or Firm—Lowe, Price, LeBlanc & Becker

[57] ABSTRACT

A bit line reset transistor resets every second bit line of a plurality of bit lines to be write-verified. At this time, a transfer gate disconnects a column latch from the unreset bit line. Then, the unreset bit line is precharged in accordance with data of the column latch, while applying a verify voltage to a word line. Then, a source line transistor grounds a source line, and the bit line is connected to the column latch, so that data corresponding to a value of a threshold voltage of the memory cell is held by the column latch, and a write verifying operation is performed.

20 Claims, 10 Drawing Sheets

FIG. 10 PRIOR ART

NON-VOLATILE SEMICONDUCTOR MEMORY DEVICE ALLOWING FAST VERIFYING OPERATION

BACKGROUND OF THE INVENTION

1. Field of the Invention

The present invention relates to a non-volatile semiconductor memory device allowing electrical writing and erasing, and in particular to a non-volatile semiconductor memory device performing verifying operation of checking the state of memory cells connected to bit lines, source lines and word lines

2. Description of the Background Art

Flash memories which are non-volatile semiconductor memory devices allowing electrical writing and erasing are non-volatile memories that have recently been researched and developed vigorously because extension of the market can be expected owing to their low cost and electrical erasability.

Figure 7:
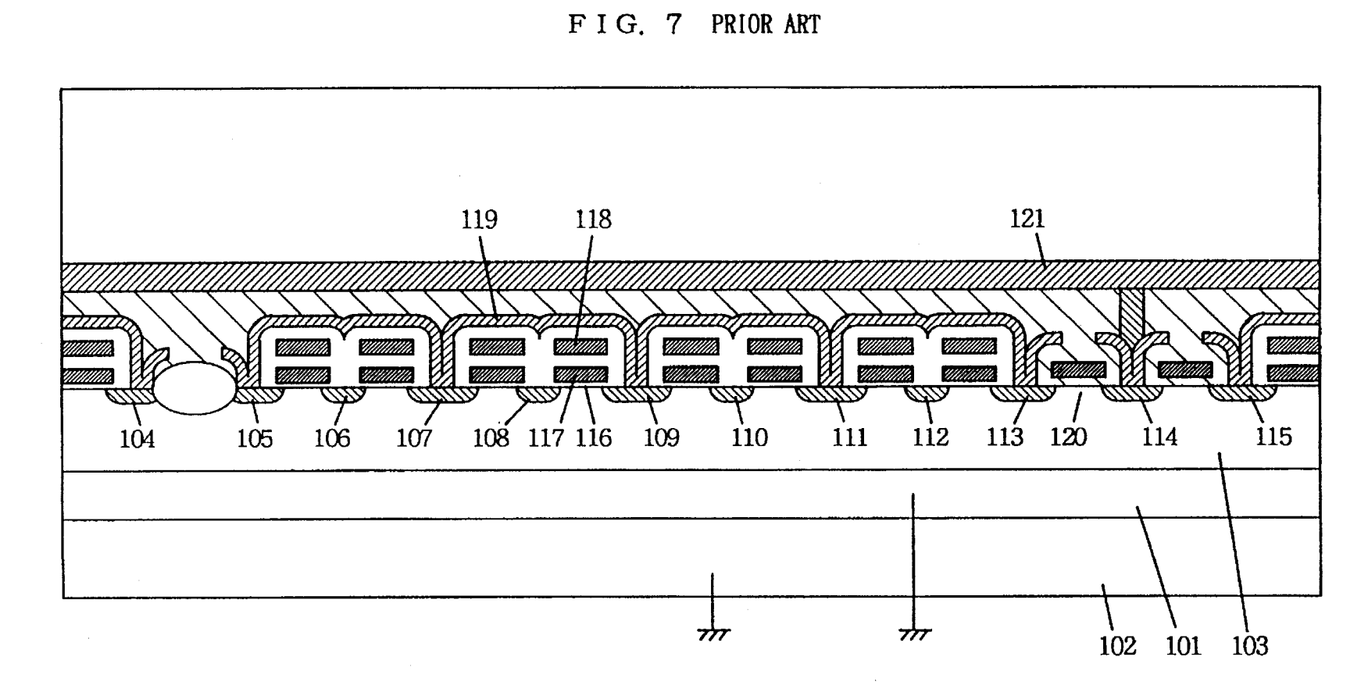
FIG. 7 shows a sectional structure of a DINOR type flash memory.

A conventional flash memory will be described below with reference to the drawings. FIG. 7 shows a sectional structure of a DINOR-type flash memory in the prior art.

Referring to FIG. 7, the flash memory includes an N-type well 101, a P-type semiconductor substrate 102, a P-type well 103, $N^+$-type impurity regions 104–115, a thin insulating layer 116, floating gates 117, control gates 118, a polycrystalline silicon layer 119, select gates 120 and a main bit line 121.

N-type well 101 isolates P-type semiconductor substrate 102 and P-type well 103 from each other. $N^+$-type impurity regions 114–115 are formed in P-type well 103 with a predetermined space between each other. Floating gates 117 are formed on regions between the impurity regions with extremely thin insulating layer 116 (about 100 Å) therebetween. Control gate 118 is formed above each floating gate 117 with an insulating film therebetween. Owing to the above structure, the memory cells are formed of MOS transistors of a two-layer gate structure. Impurity regions 114–115 are used as drains or sources. Each drain is connected to the third layer, i.e., polycrystalline silicon layer 119 serving as a sub-bit line. Polycrystalline silicon layer 119 is connected to main bit line 121 via select gate 120. Each sub-bit line is generally connected to 8 to 64 memory cells, which form one sector (block).

Figure 8:
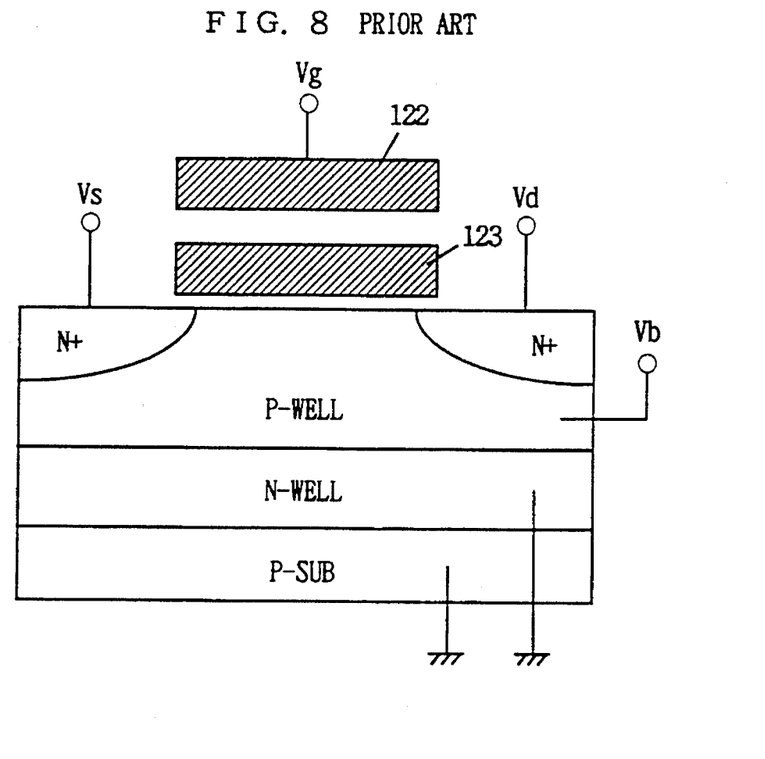
FIG. 8 shows writing/erasing operations of a conventional flash memory.
Figure 9:
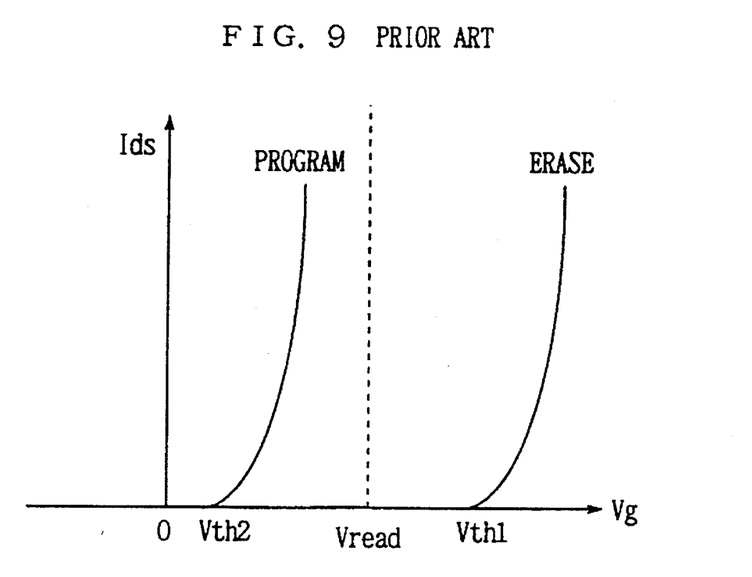
FIG. 9 shows a threshold voltage of the conventional flash memory during programming and erasing.

Writing and erasing operations of the flash memory will be described below. FIG. 8 shows writing/erasing operations of the conventional DINOR-type flash memory. FIG. 9 shows a threshold voltage of the conventional DINOR-type flash memory during programming and erasing.

Referring to FIG. 8, information is stored in the flash memory by injecting electrons into a floating gate 123 or removing electrons therefrom, More specifically, when floating gate 123 contains electrons injected thereinto, the threshold voltage of memory transistor viewed from a control gate 122 is high. In other words, a current does not flow if it is higher than the gate voltage Vread as shown in FIG. 9. This state is called an erased state, in which data corresponds to "1". When electrons are removed from floating gate 123, the threshold voltage viewed from control gate 122 decreases. More specifically, the current flows if it is lower than the gate voltage Vread as shown in FIG. 9. This state is called a programmed state, in which data corresponds to "0". In the flash memory, the above two states are detected, and written information is read by a sense amplifier.

Referring to FIG. 8, general writing and reading operations of the DINOR-type flash memory will be described below more specifically. In the erasing operation, a high voltage of about 10 V is applied as a control gate voltage Vg to control gate 122, and a negative P-well voltage Vb and a negative source voltage Vs each being about −8 V are applied to the P-well and source, respectively. As a result of application of these voltages, a channel is generated in the memory cell, and a high voltage of about 18 V is applied across control gate 122 and channel, so that electrons are injected into floating gate 123 by the tunnel effect.

In the writing operation, a negative control voltage Vg of about −8 V is applied to control gate 122, and a positive drain voltage Vd of about 6 V is applied to the drain. As a result of application of these voltages, a high voltage of about 14 V is applied across the drain and control gate 122, so that electrons are removed from the floating gate by the tunnel effect. In this operation, P-well voltage Vb of the P-well is the ground voltage, and source voltage Vs of the source is in the floating state. By the application of the predetermined voltages described above, writing and erasing can be effected on the memory cell.

In the conventional DINOR-type flash memory, as described above, when electrons are removed by the tunnel effect, the electrons may be removed excessively and thus the floating gate may be charged positively. This is called "over-write". Since the threshold voltage viewed from the control gate is negative, a leak current flows through a memory cell which was over-programmed during the writing/reading, so that correct operation cannot be performed. Therefore, write verify is performed with the sense amplifier to check whether the correct writing operation was performed during writing or not, and erase verify is performed with the sense amplifier to check whether the correct erasing operation was performed during erasing or not. In general, one sense amplifier is provided for a plurality of memory cells, i.e., a plurality of bit lines, and write/erase verifying operations are repeated multiple times for effecting write/erase verify on the memory cells to be checked.

Since the write verifying operation with the sense amplifier described above requires a long time, the conventional NAND-type flash memory uses a write verify circuit described below.

Figure 10:
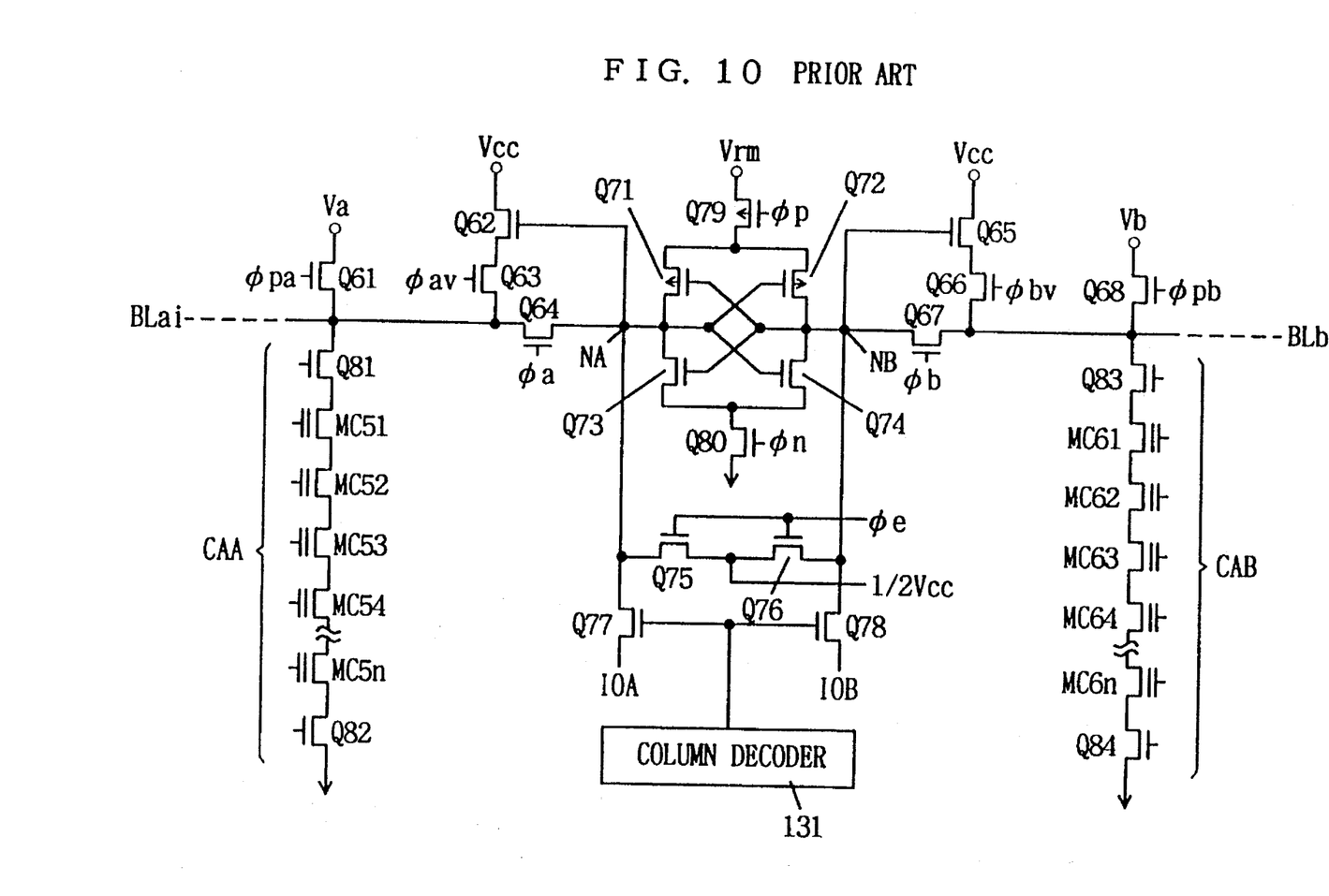
FIG. 10 shows a structure of a write verify circuit of the conventional flash memory.

The write verify circuit for performing the aforementioned write verifying operation will be described below. An example of the conventional write verify circuit in the NAND-type flash memory is disclosed in "A Quick Intelligent Program Architecture for 3 V-only NAND-EEPROMs, 1992 Symposium on VLSI Circuits Digest of Technical Papers, pp. 20–21". FIG. 10 shows a structure of a write verify circuit of the above conventional NAND-type flash memory.

Referring to FIG. 10, the conventional write verify circuit includes transistors Q61–Q68 and Q71–Q78. Transistors Q81 and Q82 and memory cells MC51–MC5n form a cell array CAA for writing, and transistors Q83 and Q84 and memory cells MC61 and MC6n form a memory cell array CAB at a dummy cell side.

Transistors Q71–Q74, Q79 and Q80 form a flip-flop circuit for latching write data, and transistors Q75 and Q76 form an equalizer circuit for equalizing the flip-flop circuit. Transistors Q62–Q64 and transistors Q65–Q67 form verify circuits for verifying a program, respectively. Each of memory cells MC 51–5n and MC61–MC6n is of an NAND type.

An operation of the write verify circuit thus constructed will be described below. In the erasing operation, all the word lines are set to 0 V, a high voltage is applied to the well of memory cell, and electrons are removed from the whole channel surface into the well by the tunnel effect. In this operation, the threshold voltage of memory cell is negative. Meanwhile, in the writing operation, write data sent from a column decoder 131 is loaded to the flip-flop circuit. In this operation, if the intended threshold voltage is high, "L" is supplied into IOA and "H" is supplied into IOB. Conversely, if the threshold voltage of low value is to be held, "H" is supplied into IOA and "L" is supplied into IOB. Then, a voltage Vrm is raised to a high value of about 10 V, a control signal φa is set to a high voltage, and a control signal φb is set to 0 V. Selected one among the control gates at the cell array CAA side is raised to a high voltage of about 18 V, and all the remaining, i.e., unselected control gates are set to 10 V. In this operation, if the output of flip-flop circuit is a high voltage of about 10 V, a potential difference between the control gate and the channel goes to 8 V, so that injection of electrons into the control gate by the tunnel effect does not occur. Meanwhile, if the output of flip-flop circuit is 0 V, electrons are injected into the floating gate. In this case, all the control gates of cell array CAB are set to 0 V, so that injection of electrons does not occur at all. Here, if the threshold voltage of memory cell is excessively higher than a power supply voltage $V_{cc}$ (3 V) during reading, the memory cell is not turned on at all, so that reading cannot be done. The reason for this is that the control gate of unselected cell is set to 3 V and the control gate of selected cell is set to 0 V for sensing whether a current flows through the bit line or not. Accordingly, a write verifying operation which will be described below is performed for checking whether or not the threshold voltage of memory cell is raised to an appropriate value not lower than 0 V but lower than 3 V.

Figures 11, 11J:
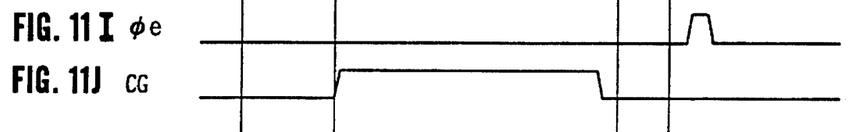
Figures 11A, 11B:
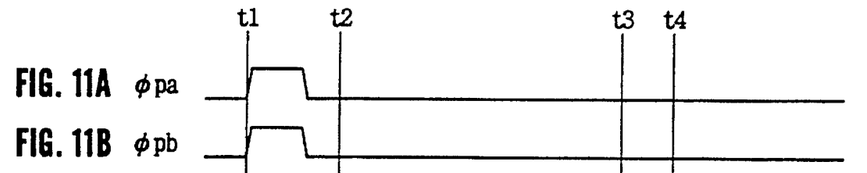
Figures 11C, 11D:
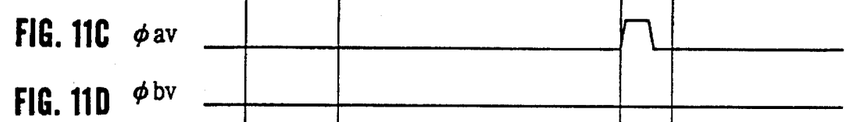
Figure 11E:
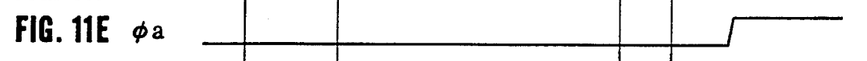
Figure 11F:
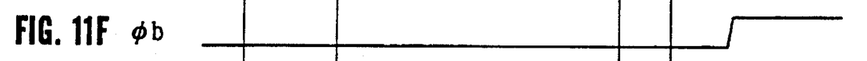
Figures 11G, 11H:
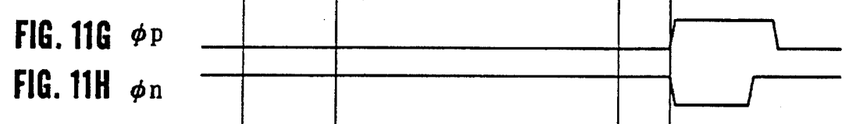

FIG. 11 is a timing chart showing the operation of write verify circuit shown in FIG. 10. After the writing, voltages Va and Vb are set to $3 \cdot V_{cc}/5$ (about 1.8 V) and $V_{cc}/2$ (about 1.5 V), respectively. At time t1, control signals φpa and φpb are set to "H", and bit lines BLai and BLbi of cell arrays CAA and CAB are charged. At time t2, the selected control gate at the cell array CAA side is supplied with 0.6 V, and the unselected control gate at the same side is supplied with 3 V. All the control gates at the cell array CAB side are supplied with 0 V. If the threshold voltage of memory cell is lower than 0.6 V (i.e., if the writing is not yet sufficient), the charged electric charges are discharged through the memory cell, and the potential of bit lines BLai lowers. Meanwhile, if it is higher than 0.6 V, the charged charges are not discharged through the memory cell, and the potential of bit line BLai is held. At time t3, a control signal φav is set to "H", and transistor Q63 is turned on. If a node NA of the flip-flop circuit is "H" (i.e., if the intended threshold voltage of the memory cell is not high), the bit line is charged again and is maintained at a high potential. Meanwhile, if node NA of the flip-flop circuit is "L" (i.e., if the intended threshold voltage of the cell is high), the bit line BLai is not charged again. At time t4, control signals φp and φn are set to "H" and "L", respectively, and then a control signal φe is set to "H", so that potentials of nodes NA and NB of the flip-flop circuit are equalized to $V_{cc}/2$ (about 1.5 V). Then, control signals φa and φb are set to "H", transistors Q64 and Q67 are turned on, and potentials of bit lines BLai and BLbi are compared with each other. In such cases that writing is done, and that the threshold voltage is increased above 0.6 V by the writing, bit line BLai is set to a value $(3 \cdot V_{cc}/5)$ higher than $V_{cc}/2$, and bit line BLai is latched at "H". Meanwhile, if the writing is not yet sufficient, the potential of bit line BLai is lower than $V_{cc}/2$, and bit line BLai is latched at "L". In this case, the writing is not yet sufficient, the writing is repeated. The above operation is effected simultaneously on multiple bits, whereby the write verifying operation is conducted.

In the conventional write verify circuit described above, since the check whether the potential of bit line is lowered or not is effect simultaneously on the multiple bits during the write verify, a remarkable problem is caused by a large noise between the bit lines. Thus, when one of the adjacent bit lines lowers from "H" to "L", this may affect the bit line to be held at "H" to lower to "L" in some cases. This influence increases as a space between the bit lines decreases in accordance with increase of the degree of integration, resulting in a problem that integration is suppressed. Since the write verifying operation requires many kinds of voltages and control signals, the circuitry is complicated, so that the circuitry scale increases, which impedes high integration.

SUMMARY OF THE INVENTION

An object of the invention is to provide a non-volatile semiconductor memory device which can reduce a write/erase verify time and is suitable for high integration.

Another object of the invention is to provide a non-volatile semiconductor memory device which can eliminate an influence by a noise between bit lines during write verify.

Still another object of the invention is to provide a non-volatile semiconductor memory device which can read a threshold voltage of a memory cell during a write/erase verifying period.

Yet another object of the invention is to provide a non-volatile semiconductor memory device allowing a program suspend operation in which writing is temporarily suspended and reading is performed during a writing operation, or a write resume operation in which a process shifts to the writing again after the write suspend operation in a stable manner.

A non-volatile semiconductor memory device according to an aspect of the invention, wherein a write verifying operation is performed to check written states of a plurality of memory cells each connected to a bit line, a source line and a word line, includes a voltage fixing circuit for fixing every second bit line to a predetermined voltage, and a write verifying unit for effecting a write verifying operation on memory cells connected to the bit lines not fixed to the predetermined voltage.

According to the above structure, since every second bit line not to be write-verified is fixed to the predetermined voltage, these bit lines act as shield lines for the bit lines to be write-verified.

More specifically, every second bit line is reset, and the verifying operation is effected on the bit lines half by half, so that the reset bit lines serve as the shield, and thus it is possible to eliminate the influence by the noise, which is cause by deviation of the signal between the bit lines during the verifying operation, and reduce a write verify time. Further, high integration of the device is allowed.

A non-volatile semiconductor memory device according to another aspect of the invention, wherein a write verifying operation is performed to check written states of a plurality of memory cells each connected to a bit line, a source line and a word line, includes column latches connected to the bit lines for latching data of the memory cells connected to the bit lines, respectively, a disconnecting circuit for electrically disconnecting the column latch from the bit line after application of a write voltage, a write verify voltage setting circuit for setting the word line connected to the memory cell to be write-verified to a verify voltage, and a ground circuit for temporarily grounding the source line of the memory cell to be write-verified after the write verify voltage setting circuit sets the word line to the write verify voltage, wherein the disconnecting circuit electrically connects the bit line and the column latch after the ground circuit grounds the source line.

According to the above structure, the column latches provided for the respective bit lines are used to disconnect the column latches from the bit lines after application of the write voltage. Then, the verify voltage is applied to the word line to be write-verified, and the source line is temporarily grounded. Thereafter, the bit line is connected to the column latch, so that the column latch holds data corresponding to a threshold voltage of the memory cell, and the write verify can be simultaneously effected on all the memory cells to be write-verified.

Accordingly, the write verifying operation can be executed fast. Also, the circuit structure can be simplified, which allows high integration of the device.

A non-volatile semiconductor memory device according to still another aspect of the invention, wherein an erase verifying operation is performed to check erased states of a plurality of memory cells each connected to a bit line, a source line and a word line, includes column latches connected to the bit lines for latching data of the memory cells connected to the bit lines, respectively, a disconnecting circuit for electrically disconnecting the column latches from the bit lines during erase verify, a precharging circuit for precharging the bit line disconnected by the disconnecting circuit to a predetermined voltage, an erase verify voltage setting circuit for setting all the word lines connected the memory cells to be erase-verified to an erase verify voltage, and a ground circuit for temporarily grounding the source line of the memory cell to be erase-verified, wherein the disconnecting circuit electrically connects the bit line and the column latch after the ground circuit grounds the source line.

According to the above structure, the column latches provided for the respective bit lines are used to disconnect the column latches from the bit lines for precharging the bit line during the erase verify. Then, the erase verify voltage is applied to all the word lines to be erase-verified, and the source line is temporarily grounded. Thereafter, the bit line is connected to the column latch, so that the column latch holds data corresponding to a threshold voltage of the memory cell, and the erase verify can be simultaneously effected on all the memory cells to be erase-verified.

Accordingly, the erase verifying operation can be executed fast. Also, the circuit structure can be simplified, which allows high integration of the device.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 3A–3K is a timing chart showing a write verifying operation of the flash memory shown in FIG. 1;

FIGS. 11A–11J is a timing chart showing an operation of the write verify circuit shown in FIG. 10.

DESCRIPTION OF THE PREFERRED EMBODIMENTS

Figure 2:
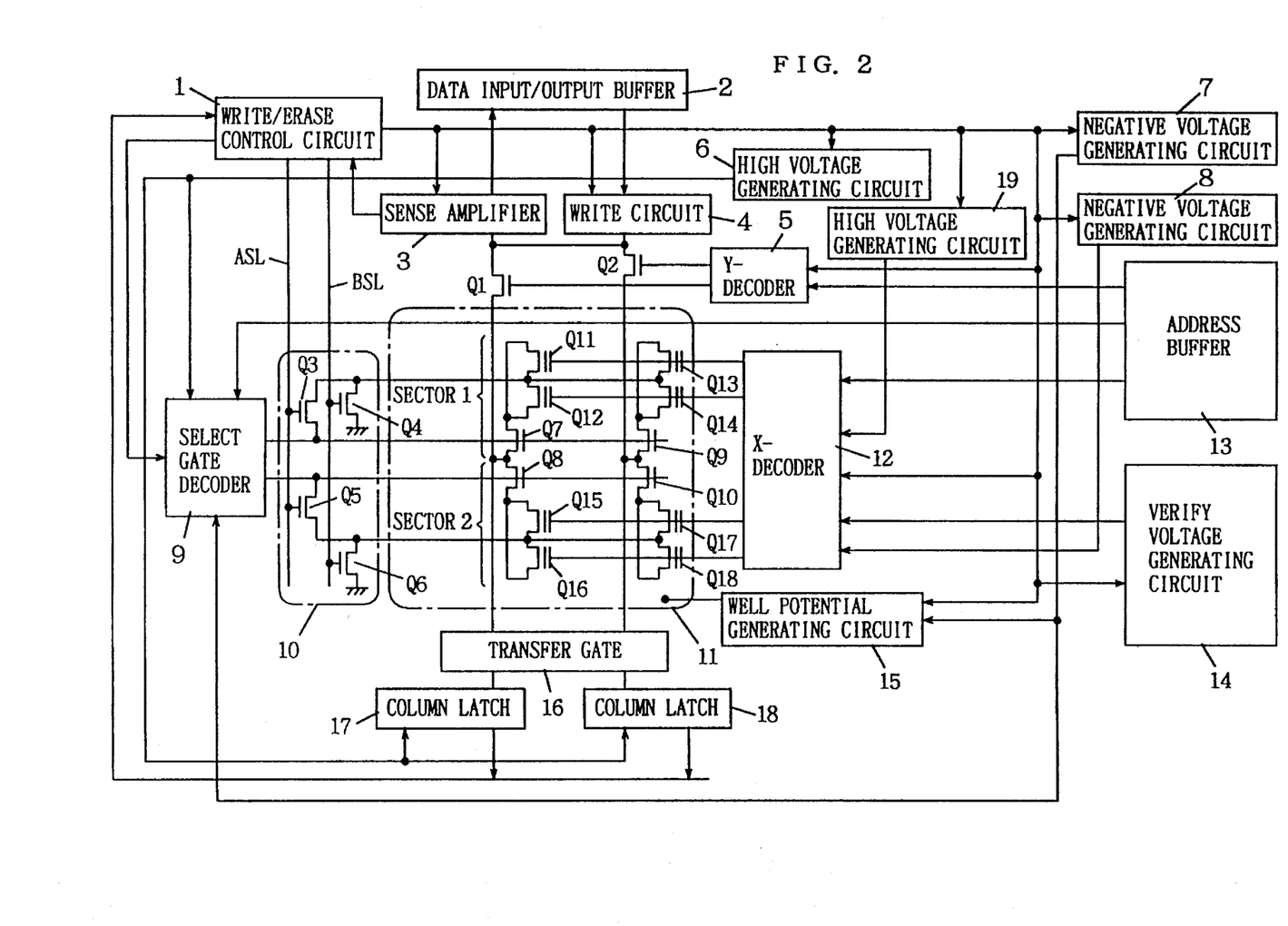
FIG. 2 is a block diagram showing a structure of a flash memory of an embodiment of the invention.

A DINOR-type flash memory which is a non-volatile semiconductor memory device of an embodiment of the invention will be described below with reference to the drawings. FIG. 2 is a block diagram showing a structure of the flash memory of the embodiment of the invention.

Referring to FIG. 2, the flash memory includes a write/erase control circuit 1, a data input/output circuit 2, a sense amplifier 3, a write circuit 4, a Y-decoder 5, high voltage generating circuits 6 and 19, negative voltage generating circuits 7 and 8, a select gate decoder 9, a source line driver 10, a memory cell array 11, an X-decoder 12, an address buffer 13, a verify voltage generating circuit 14, a well potential generating circuit 15, a transfer gate 16, column latches 17 and 18, and Y-gate transistors Q1 and Q2. In FIG. 2, a memory cell array in one memory sector is shown as if it has a structure of 2×2 for the sake of clarity.

Write/erase control circuit 1 controls timings of a writing operation and a read operation and also controls voltages for respective operations.

Data I/O buffer 2 outputs data which is supplied from sense amplifier 3, and supplies externally supplied write data to write circuit 4.

Sense amplifier 3 amplifies data of memory cells in memory cell array 11 which are supplied through Y-gate transistors Q1 and Q2 for supplying the same to data I/O buffer 2.

Write circuit 4 writes data which is supplied from data I/O buffer 2 into column latches 17 and 18.

Y-decoder 5 receives the output of address buffer 13 to select Y-gate transistors Q1 and Q2.

High voltage generating circuits 6 and 19 as well as negative voltage generating circuits 7 and 8 produce predetermined positive high voltages and predetermined negative high voltages from a voltage supplied from a single power supply during writing/erasing, respectively.

Select gate decoder 9 receives the output of address buffer 13 to select select gates Q7–Q10 in memory cell array 11.

Source line driver 10 includes NMOS transistors Q3–Q6. Source line driver 10 applies a voltage at a ground voltage level to the source line of the memory cell during reading, and applies a predetermined negative voltage during erasing.

Memory cell array 11 includes memory cells Q11–Q18 and select gates Q7–Q10. In memory cell array 11, data is written into or erased from the memory cell selected by X-decoder 12 and Y-decoder 5.

X-decoder 12 receives the output of address buffer 13 to select a predetermined word line.

Address buffer 13 receives an externally supplied address signal for selecting a predetermined memory cell in the memory cell array 11 to send the column address signal to Y-decoder 5 and send the row address signal to X-decoder 12.

Verify voltage generating circuit 14 changes the potential of word line to a predetermined verify level during write or erase verifying.

Well potential generating circuit 15 applies a negative high voltage to the P-well during erasing of the memory cell.

Transfer gate 16 controls connection between column latches 17 and 18 and the bit lines. Column latches 17 and 18 latch the write data.

An erasing operation of the flash memory thus constructed will be described below. During erasing, address buffer 13 selects one sector (block), and write/erase control circuit 1 selects all word lines (control gates) in the selected sector. Then, high voltage generating circuit 19 applies a high voltage of 10 V to all the selected word lines. Word lines in the unselected sector are grounded. Select gate decoder 9 operates to generate −8 V in the selected sector and −4 V in the unselected sector by negative voltage generating circuit 7.

In the above operation, control signals ASL and BSL generated by write/erase control circuit 1 go to 0 V and 8 V, respectively, so that the source lines of memory cells are connected to select gates. As a result, the source lines of the selected sector go to −8 V, and the source lines in the unselected sector go to −4 V. Well potential generating circuit 15 produces a negative voltage of −8 V from the voltage supplied from negative voltage generating circuit 7 and applies it to the P-well.

Accordingly, the channels are formed at the memory cells in the selected sector, and a high voltage of 18 V is applied to the word lines, i.e., across the word lines and the channels, so that electrons are injected into the floating gates by the tunnel effect. Meanwhile, in the unselected sector, the word lines are maintained at 0 V, and the source lines are maintained at −4 V, so that the potential difference is insufficient, and thus injection of electrons by the tunnel effect does not occur.

After application of the erase voltage, verify voltage generating circuit 14 is activated, so that the erase verify voltage of about 6 V is applied to the word line via X-decoder 12, and the sense amplifier senses whether a current is generated or not. When threshold voltages of all the selected memory cells are higher than 6 V, i.e., a current is not generated in any of them, the erasing operation is terminated. When the current is generated in at least one bit of the selected memory cells, the erase voltage is applied again. In this manner, the erasing operation is conducted.

Figure 1:
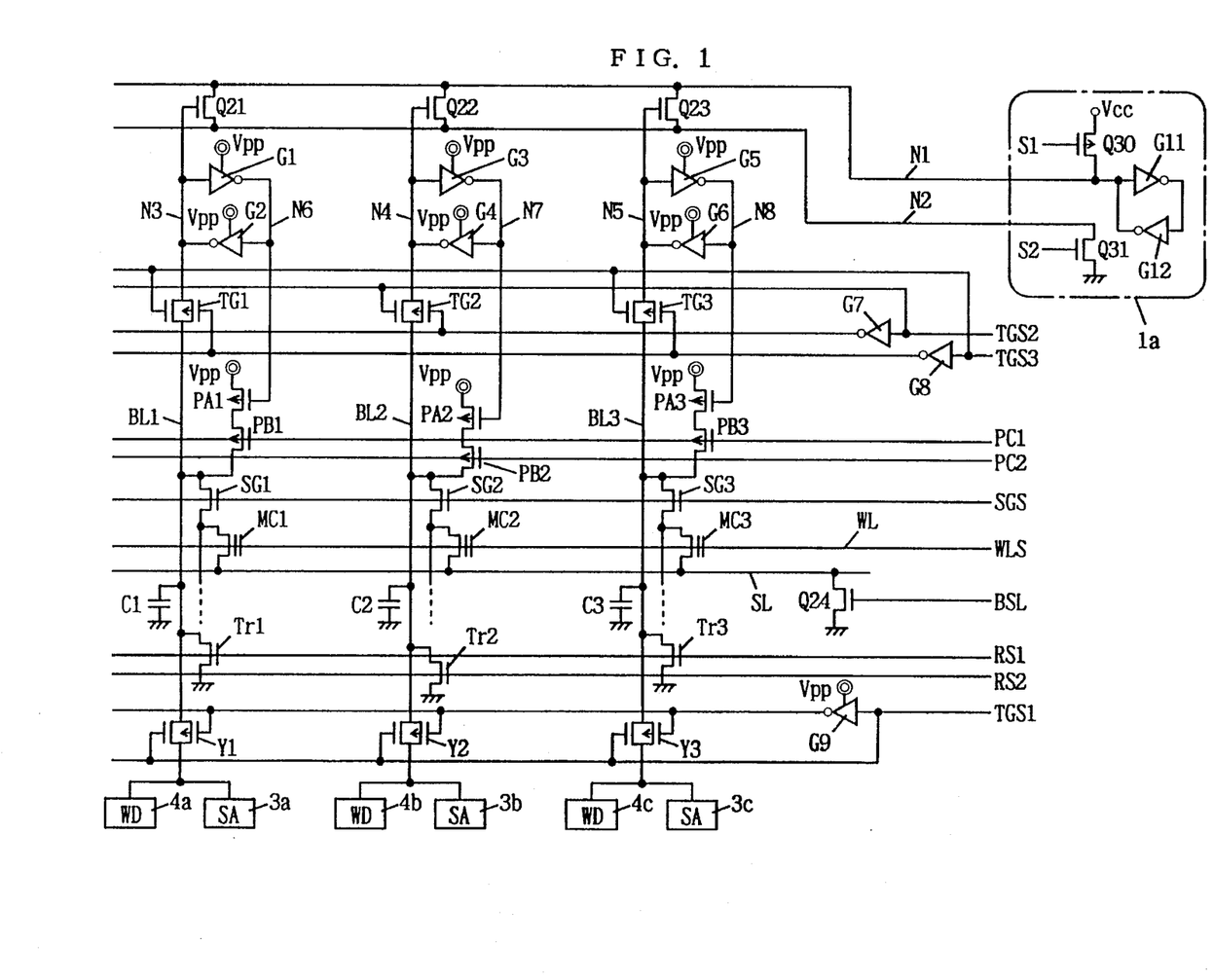
FIG. 1 is a circuit diagram showing specific structures of transfer gates and column latches shown in FIG. 2.

Transfer gate 16 and column latches 17 and 19 shown in FIG. 2 will be described further specifically. FIG. 1 is a circuit diagram showing specific structures of the transfer gate and column latches shown in FIG. 2.

Referring to FIG. 1, a plurality of bit lines BL1–BL3 each are connected at one end to Y-gates Y1–Y3. Each of Y-gates Y1–Y3 is formed of a P-type MOS transistor and an N-type MOS transistor, and thus is a complementary transfer gate. Y-gates Y1–Y3 are connected to write circuits (WD) 4a–4c and sense amplifiers (SA) 3a–3c, respectively. In each of Y-gates Y1–Y3, the N-type MOS transistor is supplied at its gate with a Y-gate control signal TGS1, and the P-type MOS transistor is supplied at its gate with the Y-gate control signal via an inverter G9. Inverter G9 is supplied with a high voltage $V_{pp}$ higher than power supply voltage $V_{cc}$.

Bit lines BL1–BL3 are connected to bit line reset transistors Tr1–Tr3, respectively. Bit line reset transistors Tr1–Tr3 are grounded at the other ends. Bit line reset transistors Tr1 and Tr3 are supplied at their gates with a reset signal RS1, and bit line reset transistor Tr2 is supplied at its gate with a reset signal RS2. Thus, the bit line reset transistor for every second bit line, i.e., for each of alternate bit lines is supplied at its gate with the same reset signal RS1 or RS2.

Bit lines BL1–BL3 are connected to select gates SG1–SG3, respectively. Select gates SG1–SG3 are supplied at their gates with a select gate control signal SGS.

Select gates SG1–SG3 are connected to memory cells MC1–MC3, respectively. Source sides of memory cells MC1–MC3 are connected to a source line transistor Q24. The other end of source line transistor Q24 is grounded. The gate of source line transistor Q24 receives control signal BSL supplied from write/erase control circuit 1.

Bit lines BL1–BL3 are connected to precharge transistors PA1–PA3 and PB1–PB3, respectively. Precharge transistors PA1–PA3 each are connected at the other end to high voltage $V_{pp}$. Precharge transistors PB1 and PB3 receive on their gates a precharge control signal PC1, and precharge transistor PB2 receives on its gate a precharge control signal PC2. Thus, every second bit line, i.e., each of alternate bit lines receives the same precharge control signal PC1 or PC2. Precharge transistors PA1–PA3 receive on their gates the output signals of inverters G1, G3 and G5.

The other ends of bit lines BL1–BL3 are connected to transfer gates TG1–TG3, respectively. Each of transfer gates TG1–TG3 is formed of a P-type MOS transistor and an N-type MOS transistor. N-type MOS transistors of transfer gates TG1 and TG3 receive on their gates a transfer gate control signal TGS3, and P-type MOS transistors thereof receive on their gates a transfer gate control signal TGS3 via an inverter G8. N-type MOS transistor of transfer gate TG2 receives on its gate a transfer gate control signal TGS2, and P-type MOS transistor thereof receives on its gate a transfer gate control signal TGS2 via an inverter G7. Thus, the transfer gate for every second bit line receives the same transfer gate control signal TGS2 or TGS3.

Transfer gates TG1–TG3 are connected to input sides of inverters G1, G3 and G5, respectively, and are also connected to the output sides of inverters G2, G4 and G6, respectively. Inverters G1 and G2, G3 and G4, and G5 and G6 form the column latches, respectively. Inverters G1–G6 are supplied with high voltage $V_{pp}$.

N-type MOS transistors Q21–Q23 are connected to a write/erase control circuit 1a. Transistors Q21–Q23 are connected at their gates to transfer gates TG1–TG3, respectively.

Write/erase control circuit 1a is shown as a part of write/erase control circuit 1 shown in FIG. 2, and includes inverters G11 and G12.

Each of transistors Q30 and Q31 is connected to transistors Q21–Q23. The other end of transistor Q30 is connected to power supply voltage $V_{cc}$, and the other end of transistor Q31 is grounded. Thus, transistors Q21–Q23 are wired-OR-connected.

Each of the control signals described above is generated by a predetermined control signal generating circuit (not shown) in accordance with a timing which will be described below.

Writing operation of the flash memory having the above structure will be described below. For the writing, write/erase control circuit 1 activates write circuit 4. For example, Y-gate control signal TGS1 and transfer gate control signal TGS2 and TGS3 for controlling Y-gates Y1–Y3 and transfer gates TG1–TG3 attain "H". At this time, write data is loaded into column latches G1–G6. Then, Y-gate control signal TGS1 attains "L", and voltages $V_{pp}$ of column latches G1–G6 go to 6 V. Y-gate control signal TGS1 controls Y-gates Y1–Y3 to disconnect bit lines BL1–BL3 from write circuits 4a–4c and sense amplifiers 3a–3c, and a write voltage is applied to the bit line. At this time, select gate control signal SGS and word line WL are maintained at 10 V and –8 V, respectively. In this manner, the writing operation is conducted.

Figure 3:
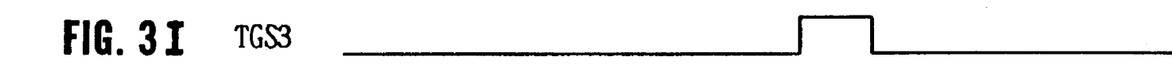
Figure 3A:
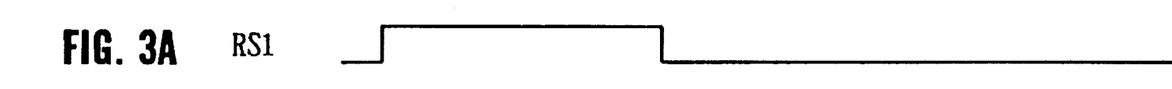
Figure 3B:
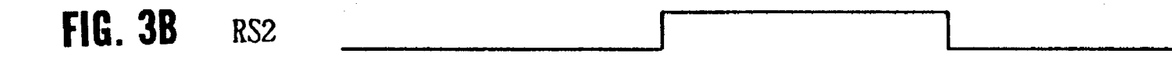
Figure 3C:
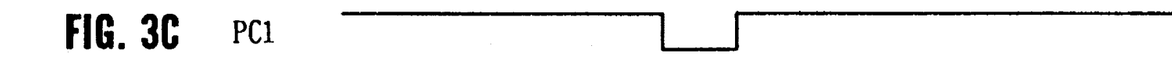
Figure 3D:
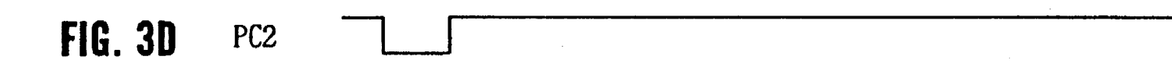
Figure 3E:
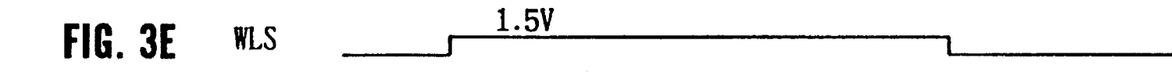
Figure 3F:
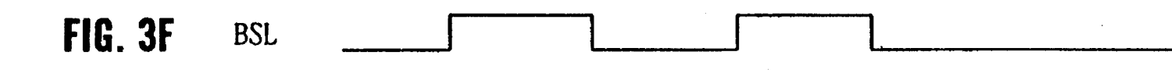
Figure 3G:
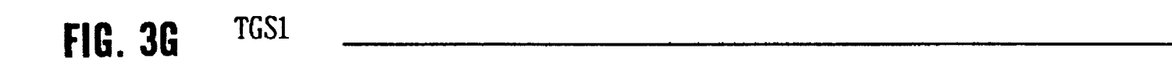
Figure 3H:
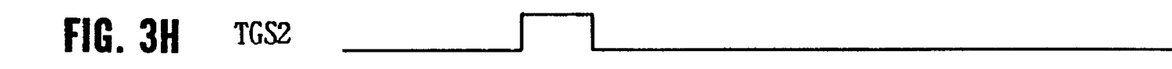
Figure 3J:
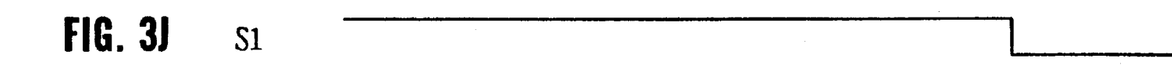
Figure 3K:
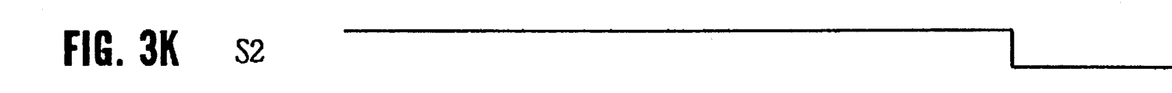

Then, the operation for write verify will be described below. FIG. 3 is a timing chart showing a write verifying operation of the flash memory shown in FIG. 2.

Referring to FIG. 3, reset signal RS1 is set to "H" so that bit lines BL1 and BL3 are grounded during write verify. At this time, Y-gate control signal TGS1 and transfer gate control signals TGS2 and TGS3 all are set to "L". Precharge control signal PC1 is set to "H". Then, precharge control signal PC2 is temporarily set to "L". When the potential at node N7 is "L", bit line BL2 is precharged. When it is "H", bit line BL2 is not precharged. Then, voltage WLS of word line WL is set to the write verify voltage not higher than 1.5 V, control signal BSL is set to "H", and source line transistor Q24 is temporarily grounded. At this time, if the threshold voltage of memory cell MC2 is lower than the write verify voltage, the precharged charges are discharged, and conversely, if higher, the precharged charges are maintained as they are. When transfer gate control signal TGS2 is set to "H" thereafter, transfer gate TG2 is turned on, and bit line BL2 is connected to column latch G3 and G4. Here, inverter G4 has been set to have a remarkably weak current drive capability. More specifically, if a capacitance of parasitic capacity C2 of bit line BL2 is, for example, 0.8 pF, it is preferable to set the channel width of the transistor forming the inverter to about 3 µm and the channel length thereof to about 1.7 µm. The same is true with respect to the column latches described below. Accordingly, when the potential at node N4 is "H", the following state is attained. Immediately after transfer gate control signal TGS2 goes to "H", and the bit line BL2 is connected to column latch G3 and G4, a charging current occurs at bit line BL2. However, since the current drive capability of inverter G4 is remarkably weak, data of column latch G3 and G4 is inverted, so that the potential at node N4 falls to "L". Meanwhile, when the threshold voltage of memory cell MC2 is higher than the write verify voltage, the potential of bit line does not fall, so that data of column latch G3 and G4 is not inverted, and the potential at node N4 maintains "H". However, if the potential at node N4 was previously "L", bit line BL2 has not been precharged. Therefore, when transfer gate TG2 is opened, column latch G3 and G4 is not inverted and is maintained at "L". The above operation is simultaneously effected on every two bit lines.

When the verifying operation of memory cell MC2 connected to bit line BL2 is completed, the verifying operation then starts at memory cells MC1 and MC3 connected to bit lines BL1 and BL3, respectively. Thus, reset signal RS1 attains "L", reset signal RS2 attains "H", and precharge control signal PC2 attains "H". At this time, transfer gate control signals TGS2 and TGS3 are "L". Word line WL is maintained at the previous write verify voltage. In this state, precharge control signal PC1 is temporarily set to "L" for precharging bit lines BL1 and BL3 in accordance with data stored in column latches G1, G2, G5 and G6. Operations after this are the same as those for the verify of memory cell MC2 connected to bit line BL2 already described. In accordance with the aforementioned operations, the data latched by column latches G1–G6 are monitored by wired-OR-connected transistors Q21–Q23. More specifically, P-type MOS transistor Q30 of write/erase control circuit 1a charges node N1 to "H". After the verifying operation at column latches G1–G6, N-type MOS transistor Q31 grounds node N2. Therefore, if there exists at least one column latch G1–G6 of which node N3–N5 attains "H", i.e., if the writing is not completed, the potential at node N1 falls to "L" through transistor Q21–Q23. Here, inverter G12 has been set have a weak current drive capability similarly to inverters G2, G4 and G6. Accordingly, by monitoring node N1, the write verifying operation can be performed for determining whether the writing is performed correctly or not.

According to the above operations, every second bit line which is reset serves as a shield during verify, so that an influence by the noise between bit lines can be eliminated to perform the stable verifying operation, and thus the nonvolatile semiconductor memory device can be integrated to a higher extent.

Since the verifying operation is performed two times, and each being performed simultaneously for the half, the entire verifying operation can be performed faster than the write verifying operation by the sense amplifiers.

Description will now be given on the operations for write suspend in which writing is temporarily suspended and reading is performed during the writing operation as well as for write resume in which the operation shifts to the write mode after completion of the write suspend.

For the write suspend, transfer gate control signals TGS2 and TGS3 are set to "L". Precharge control signals PC1 and PC2 are "H". Thus, column latches G1–G6 are disconnected from bit lines B1–B3 to turn off precharge transistors PB1–PB3. In this state, reset signals RS1 and RS2 are temporarily set to "H" to reset bit lines BL1–BL3. Then, Y-gate control signal TGS1 is set to "H" to read data of the memory cells, into which data is not currently to be written, through sense amplifiers 3a–3c. In this manner, the write suspend operation can be performed stably.

When the read operation is completed thereafter, Y-gate control signal TGS1 is set to "L" to disconnect bit lines BL1–BL3 from sense amplifiers 3a–3c, respectively. Then, precharge control signals PC1 and PC2 are temporarily set to "L" to precharge bit lines BL1–BL3 in accordance with data of column latches G1–G6. After completion of precharging, transfer gate control signals TGS2 and TGS3 are set to "H" to connect column latches G1–G6 to bit lines BL1–BL3. Then, voltage $V_{pp}$ is raised from 3.3 V to 6 V for continuing the writing operation. In this manner, the write resume operation can be performed stably.

Figure 4:
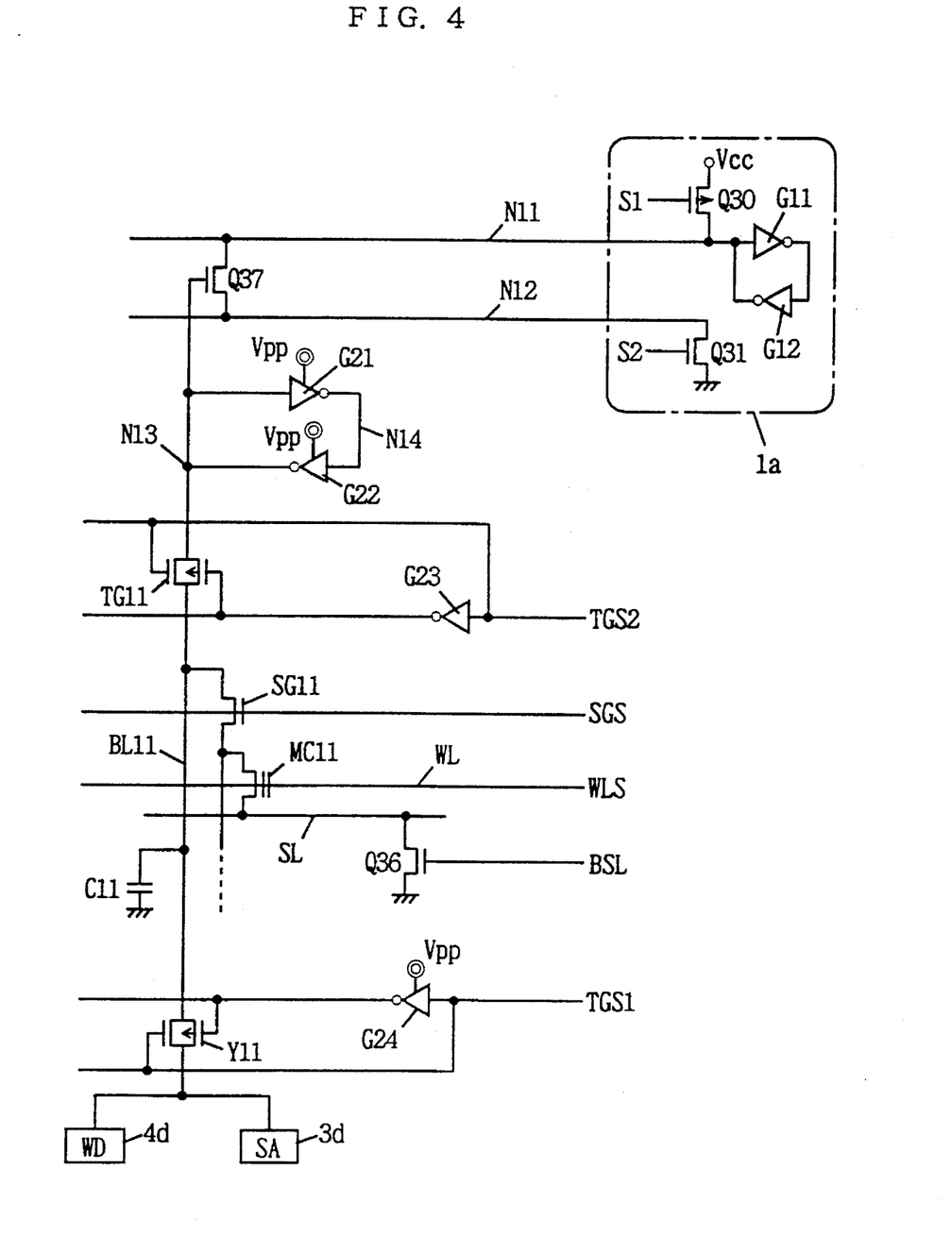
FIG. 4 is a circuit diagram showing another example of specific structures of the transfer gate and column latch.

Description will not be given on specific structures of the transfer gates and column latches which can simultaneously perform the write verifying operation for all the memory cells to be write-verified. FIG. 4 is a circuit diagram showing another example of a specific structure of the transfer gate and column latch. The circuit shown in FIG. 4 differs from the circuit shown in FIG. 1 in that the bit line reset transistor and precharge transistor are eliminated, and one transfer gate control signal TGS2 is supplied to the gate of transfer gate TG11. The others are the same as those of the circuit shown in FIG. 1, and hence will not be described below.

Description will now be given on the writing operation and write verifying operation of the circuit shown in FIG. 4. After the erasing operation, write/erase control circuit 1 activates a write circuit 4d. Then, Y-gate control signal TGS1 and transfer gate control signal TGS2 are raised to "H". Therefore, a bit line BL11 is connected to write circuit 4d and a column latch G21 and G22, and the write data is loaded into column latch G21 and G22. Then, Y-gate control signal TGS1 attains "L", and, in response to Y-gate control signal TGS1, a Y-gate Y11 disconnects bit line BL11 from write circuit 4d and sense amplifier 3d, and the write voltage is applied to bit line BL11. At this time, select gate control signal SGS and the voltage of word line WL are 10 V and −8 V, respectively.

After application of the write voltage, the high voltage $V_{pp}$ is lowered from 6 V to 3.3 V, and transfer gate control signal TGS2 is set to "L". In accordance with transfer gate control signal TGS2, transfer gate TG11 is turned off to disconnect bit line BL11 from column latch G21 and G22. At this time, bit line BL11 holds the voltage of 0 V or 3.3 V according to the data of column latch G21 and G22. Then, the voltage of word line WL is set to the verify voltage not higher than 1.5 V, control signal BSL is set to "H", and source line SL is temporarily grounded. In this state, if the threshold voltage of memory cell MC11 into which data was written has fallen below 1.5 V, charges charged into bit line BL11 are discharged via memory cell MC11. Then, transfer gate control signal TGS2 is raised to "H" to connect bit line BL11 to column latch G21 and G22. Inverter G22 of the column latch has been set to have a weak current drive capability similarly to the aforementioned case. Therefore, data of column latch G21 and G22 is inverted in spite of the fact that the charging current occurs in bit line BL11 because the current drive capability of the inverter G22 is very weak. As a result, the potential at a node N13 falls to "L". Meanwhile, if the threshold voltage of memory cell MC11 is higher than the verify voltage, the potential of bit line BL11 does not fall, so that data of column latch G21 and G22 is not inverted, and node N13 hold the potential of "H".

In this manner, the data held by column latch G21 and G22 can be monitored by wired-OR-connected transistor Q37 similarly to the aforementioned case. Therefore, information of the write verify can be obtained by monitoring the potential at a node N11, so that the write verifying operation can be simultaneously effected on all the memory cells to be write-verified, and the write verify can be performed fast. The numbers of voltages and control signals used for the write verifying operation can be smaller than those for the conventional write verifying operation shown in FIG. 10, which allows simplification of the circuit structure and high integration of the device.

Figure 5:
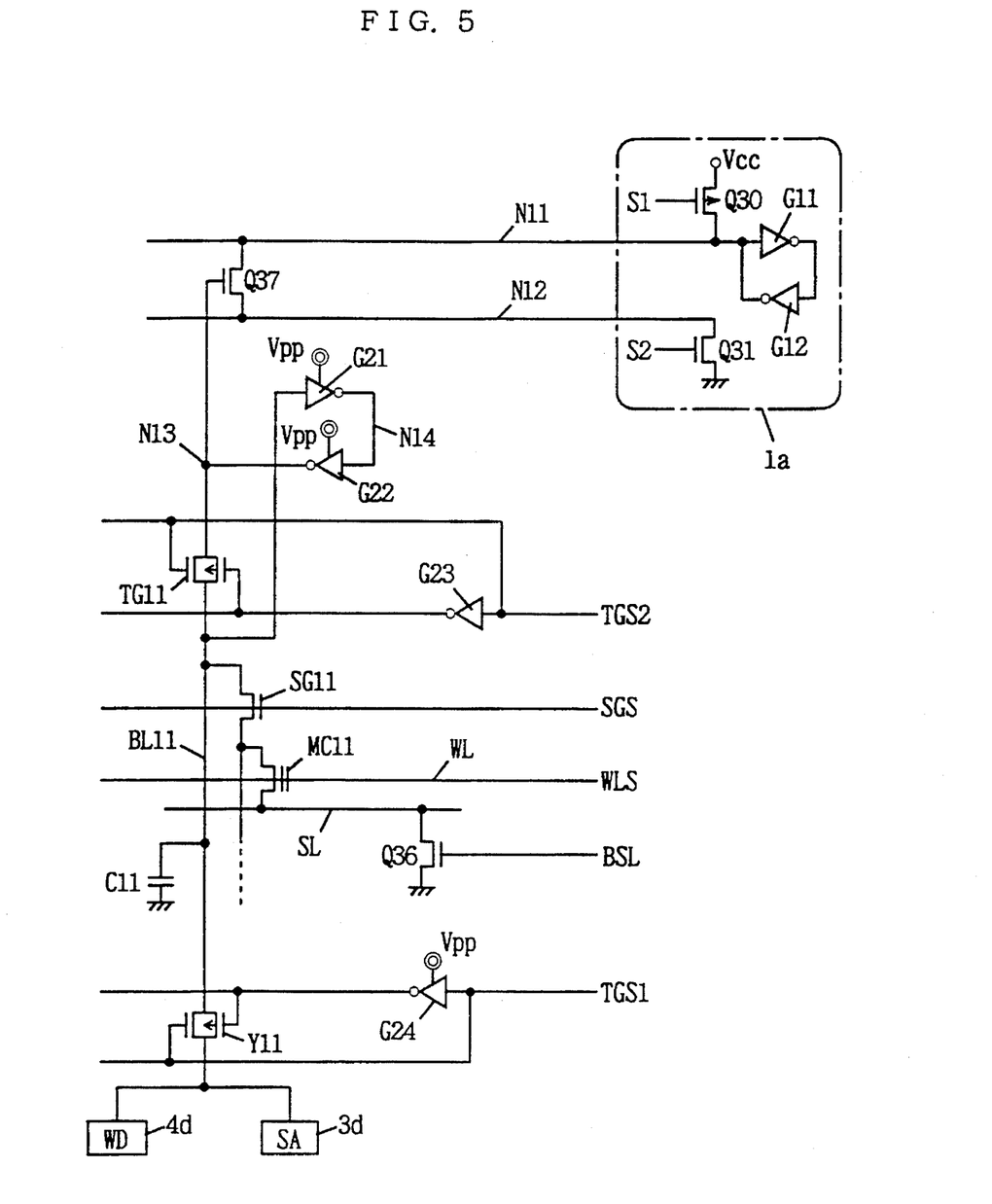
FIG. 5 is a circuit diagram showing still another specific structure of the column latch shown in FIG. 4.

Another example of the specific structure of the column latch shown in FIG. 4 will be described below. FIG. 5 is a circuit diagram showing another example of the specific structure of the column latch shown in FIG. 4.

Referring to FIG. 5, the column latch includes inverters G21 and G22. An input side of inverter G21 is connected directly to bit line BL11. Other structures are the same as those of the column latch shown in FIG. 4, and will not be described below. Owing to the above structure, the potential of bit line BL11 can be directly sensed by inverter G21, and, at the time of fixing of data of inverter 22, transfer gate control signal TGS2 can be set to "H" to connect bit line BL11 to column latch G21 and G22. Therefore, inverter G22 can perform the writing operation further stably by using the inverter having a sufficiently high current drive capability.

Figure 6:
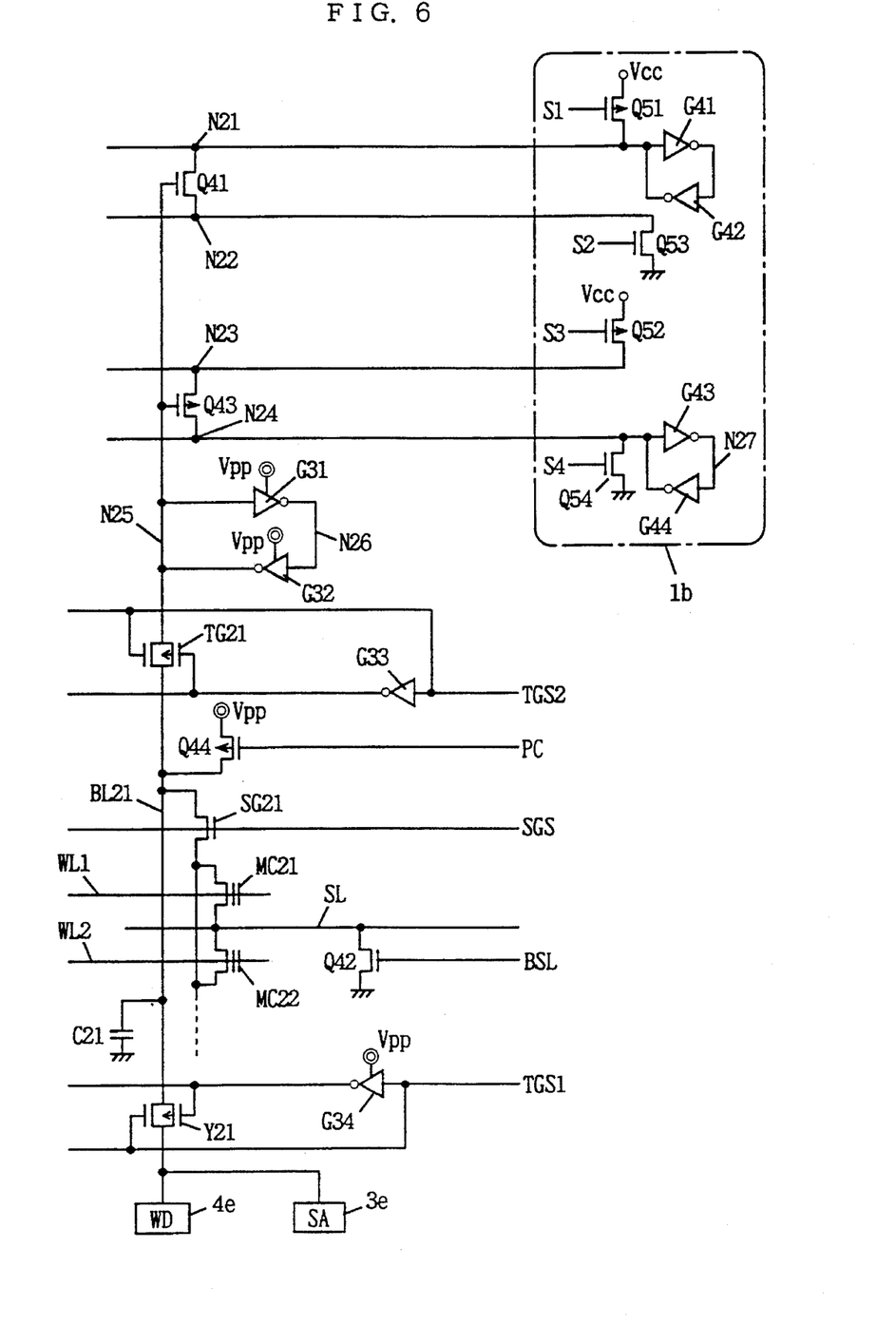
FIG. 6 is a circuit diagram showing yet another example of structures of the transfer gate and column latch shown in FIG. 2.

Description will not be given on the specific structures of the transfer gate and column latch which allow the erase verifying operation to be effected simultaneously on all the memory cells to be erase-verified. FIG. 6 is a circuit diagram showing still another example of the structures of the transfer gate and column latch shown in FIG. 2.

The circuit shown in FIG. 6 differs from the circuit shown in FIG. 4 in that it includes a P-type MOS transistor Q44 connected to bit line BL21. Further, the output of a column latch G31 and G32 is also supplied to the gate of a P-type MOS transistor Q43. The source and drain of P-type MOS transistor Q43 are wired-OR-connected to another column latch, and specifically connected to a latch G43 and G44, a P-type MOS transistor Q52 and an N-type MOS transistor Q54 in a write/erase control circuit 1b. The other structures are the same as those of the circuit shown in FIG. 4, and hence will not be described below.

Operation of the circuit thus constructed will be described below. Writing operation and write verifying operation are the same as those of the flash memory shown in FIG. 4, and hence will not be described below. For erasing, all word lines WL1 and WL2 of the selected sector are raised to 10 V to apply a voltage of −8 V to the sources of memory cells MC21 and MC22. A circuit for supplying the voltage of −8 V is not shown in the figure. When the erasing operation is completed, precharge signal PC is temporarily set to "L" (at this time, both Y-gate control signal TGS1 and transfer gate control signal TGS2 are "L") and bit line BL21 is precharged. Then, all the selected word lines are set to about 6 V (i.e., erase verify voltage), and control signal BSL is temporarily set to "H" for grounding source line SL. When at least one bit of the memory cells in the selected sector has the threshold voltage lower than 6 V, the precharged charges are discharged. Conversely, when the threshold voltages of all the bit lines are not lower than 6 V, the charges are not discharged and are maintained as they are. Thereafter, transfer gate control signal TGS2 is set to "H", and bit line BL21 is connected to column latch G31 and G32. Column latch G31 and G32 fixes the voltage of bit line BL21. Meanwhile, a control signal S4 of "H" is supplied to the gate of N-type MOS transistor Q54 in write/erase control circuit 1b. At this time, node N24 is reset to "L". Then, a control signal S3 of "L" is supplied to the gate of P-type MOS transistor Q52. Thereby, when the potential at node N25 is "L", the potential at node N24 attains "H", and conversely, when the potential at node N25 is "H", the potential at node N24 is maintained at "L". Thus, when all the bits have the threshold voltage higher than 6 V during the erase verify, the potential at node N24 attains "L", and, when at least one bit has the threshold voltage lower than 6 V, the potential at node N24 attains "H". Therefore, by monitoring the potential at node N24, information of erase verify can be obtained, and the erase verifying operation can be effected simultaneously on all the memory cells to be erase-verified, so that the erase verifying operation can be performed fast. Further, the voltages and control signals used for the erase verifying operation are small in number, so that the circuit structure is simplified, and further, high integration of the device is allowed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A non-volatile semiconductor memory device wherein a write verifying operation is performed to check written states of a plurality of memory cells each connected to a bit line, a source line and a word line, comprising:

voltage fixing means for fixing every second bit line to a predetermined voltage; and write verifying means for effecting the write verifying operation on memory cells connected to the bit lines not fixed to said predetermined voltage.

2. The non-volatile semiconductor memory device according to claim 1, wherein said predetermined voltage includes a ground voltage.

3. The non-volatile semiconductor memory device according to claim 2, wherein said voltage fixing means includes, a plurality of first transistors each having one end connected to said bit line, the other end receiving the ground potential, and a gate receiving a first bit line reset signal, and a plurality of second transistors each having one end connected to said bit line, the other end receiving the ground potential, and a gate receiving a second bit line reset signal, said bit lines connected to said plurality of first transistors being located alternately to said bit lines connected to said second transistors.

4. The non-volatile semiconductor memory device according to claim 1, wherein said write verifying means includes, column latches provided correspondingly to said bit lines, respectively, for latching data of memory cells connected to said bit lines, disconnecting means for electrically disconnecting a column latch from said bit line after application of a write voltage, precharging means for precharging said bit line disconnected by said disconnecting means to a predetermined voltage in accordance with the data latched by said column latch, write verify voltage setting means for setting the word line connected to the memory cell to be write-verified to a write verify voltage, and grounding means for temporarily grounding the source line connected to the memory cell to be write-verified after said write verify voltage setting means sets said word line to the write verify voltage, said disconnecting means electrically connecting said bit line to said column latch after said grounding means grounds said source line.

5. The non-volatile semiconductor memory device according to claim 4, wherein said column latch includes, a first inverter having an output end connected to said disconnecting means, and a second inverter having an input end connected to said disconnecting means and an output end connected to said first inverter.

6. The non-volatile semiconductor memory device according to claim 4, wherein said precharging means includes, a plurality of first transistors provided correspondingly to said bit lines, having gates connected to the corresponding column latches, and each having an end receiving a high voltage higher than a power supply voltage, and a plurality of second transistors provided correspondingly to said first transistors, each having one end connected to the other end of the corresponding first transistor and the other end connected to the corresponding bit line, and having gates receiving a precharge control signal for controlling a precharging operation;

said precharge control signal includes first and second precharge control signals; and said first and second precharge control signals are alternately supplied to the gates of said plurality of second transistors.

7. The non-volatile semiconductor memory device according to claim 4, wherein said write verifying means includes, detecting means for detecting a write verify result by wired-OR of data latched by said column latches.

8. The non-volatile semiconductor memory device according to claim 7, wherein said detecting means includes, a plurality of first transistors provided correspondingly to said column latches and having gates connected to said column latches, a second transistor having one end connected to one end of each of said plurality of first transistors and the other end receiving the ground potential, a third transistor having one end connected to the other end of each of said plurality of first transistors and the other end receiving the power supply voltage, a first inverter having an input end connected to the other end of each of said plurality of first transistors and the one end of said third transistor, and a second inverter having an input end connected to an output end of said first inverter and an output end connected to the other end of each of said plurality of first transistors and the one end of said third transistor.

9. The non-volatile semiconductor memory device according to claim 1, wherein said non-volatile semiconductor memory device performs a write suspend operation of temporarily suspending writing and performing reading during the writing operation; and said non-volatile semiconductor memory device further comprises, column latches provided correspondingly to said bit lines, respectively, for latching data of memory cells connected to said bit lines, first disconnecting means for electrically disconnecting said column latch from said bit line during said write suspend operation, resetting means for resetting the bit line disconnected by said first disconnecting means, and reading means for reading data from the memory cell other than the memory cell for performing the writing after resetting by said resetting means.

10. The non-volatile semiconductor memory device according to claim 9, wherein said non-volatile semiconductor memory device performs a write resume operation of shifting a process to the writing after said write suspend operation; and said non-volatile semiconductor memory device further comprises, second disconnecting means for electrically disconnecting said bit line from said reading means after the reading by said reading means, and precharging means for precharging the bit line disconnected by said second disconnecting means to a predetermined voltage in accordance with the data latched by said column latch, said disconnecting means electrically connecting said bit line to said column latch after precharging by said precharging means.

11. The non-volatile semiconductor memory device according to claim 1, wherein said write verifying means effects a write verifying operation on all the memory cells connected to the bit lines other than the bit line fixed by said voltage fixing means to the predetermined voltage.

12. A non-volatile semiconductor memory device, wherein a write verifying operation is performed to check written states of a plurality of memory cells each connected to a bit line, a source line and a word line, comprising:

column latches provided correspondingly to said bit lines, respectively, for latching data of said memory cells connected to said bit lines;

disconnecting means for electrically disconnecting a column latch from said bit line after application of a write voltage;

write verify voltage setting means for setting the word line connected to the memory cell to be write-verified to a write verify voltage; and grounding means for temporarily grounding the source line of the memory cell to be write-verified after said write verify voltage setting means sets said word line to said write verify voltage, said disconnecting means electrically connecting said bit line to said column latch after said grounding means grounds said source line.

13. The non-volatile semiconductor memory device according to claim 12, wherein said column latch includes, a first inverter having an output end connected to said disconnecting means, and a second inverter having an input end connected to said disconnecting means and an output end connected to said first inverter.

14. The non-volatile semiconductor memory device according to claim 12, further comprising:

detecting means for detecting a write verify result by wired-OR of data latched by said column latches.

15. The non-volatile semiconductor memory device according to claim 14, wherein said detecting means includes, a plurality of first transistors provided correspondingly to said column latches and having gates connected to said column latches, a second transistor having one end connected to one end of each of said plurality of first transistors and the other end receiving the ground potential, a third transistor having one end connected to the other end of each of said plurality of first transistors and the other end receiving the power supply voltage, a first inverter having an input end connected to the other end of each of said plurality of first transistors and the one end of said third transistor, and a second inverter having an input end connected to an output end of said first inverter and an output end connected to the other end of each of said plurality of first transistors and the one end of said third transistor.

16. The non-volatile semiconductor memory device according to claim 12, wherein said column latch includes, a first inverter having an output end connected to said disconnecting means, and a second inverter having an input end connected to said bit line and an output end connected to said first inverter.

17. A non-volatile semiconductor memory device, wherein an erase verifying operation is performed to check erased states of a plurality of memory cells each connected to a bit line, a source line and a word line, comprising:

column latches provided correspondingly to said bit lines, respectively, for latching data of said memory cells connected to said bit lines;

disconnecting means for electrically disconnecting a column latch from said bit line during erase verify;

precharging means for precharging the bit line disconnected by said disconnecting means to a predetermined voltage;

erase verify voltage setting means for setting the word line connected to the memory cell to be erase-verified to an erase verify voltage; and grounding means for temporarily grounding the source line of the memory cell to be verified after said erase verify voltage setting means sets said word line to the erase verify voltage, said disconnecting means electrically connecting said bit line to said column latch after said grounding means grounds said source line.

18. The non-volatile semiconductor memory device according to claim 17, wherein said column latch includes, a first inverter having an output end connected to said disconnecting means, and a second inverter having an input end connected to said disconnecting means and an output end connected to said first inverter.

19. The non-volatile semiconductor memory device according to claim 17, further comprising:

detecting means for detecting an erase verify result by wired-OR of data latched by said column latches.

20. The non-volatile semiconductor memory device according to claim 19, wherein said detecting means includes, a plurality of first transistors provided correspondingly to said column latches and each having an gate connected to said column latch, a second transistor having one end connected to one end of each of said plurality of first transistors and the other end receiving the ground potential, a third transistor having one end connected to the other end of each of said plurality of first transistors and the other end receiving the power supply voltage, a first inverter having an input end connected to the other end of each of said plurality of first transistors and the one end of said third transistor, and a second inverter having an input end connected to an output end of said first inverter and an output end connected to the other end of each of said plurality of first transistors and one end of said third transistor.

* * * * *